United States Patent
Zhu et al.

(10) Patent No.: US 9,692,565 B2
(45) Date of Patent: Jun. 27, 2017

(54) AUTOMATIC FREQUENCY CALIBRATION METHOD AND SMALL CELL USING THE SAME

(71) Applicant: Sercomm Corporation, Taipei (TW)

(72) Inventors: Ling Zhu, Jiangsu Province (CN); Yuan Zhang, Jiangsu Province (CN)

(73) Assignee: SERCOMM CORPORATION, Taipei (TW)

( * ) Notice: Subject to any disclaimer, the term of this patent is extended or adjusted under 35 U.S.C. 154(b) by 77 days.

(21) Appl. No.: 14/596,252

(22) Filed: Jan. 14, 2015

(65) Prior Publication Data
US 2015/0372791 A1 Dec. 24, 2015

(30) Foreign Application Priority Data
Jun. 23, 2014 (CN) .......................... 2014 1 0284594

(51) Int. Cl.
*H04L 5/00* (2006.01)
(52) U.S. Cl.
CPC .......... *H04L 5/003* (2013.01); *H03J 2200/05* (2013.01)
(58) Field of Classification Search
CPC ..... H04W 16/14; H04W 16/16; H04W 16/32; H04W 24/02; H04W 28/16; H04W 36/0061; H04W 52/241; H04W 52/244; H04W 72/042; H04W 72/0453; H04W 72/082; H04W 84/042; H04W 84/045; H04W 84/10; H04L 1/0001; H04L 5/001; H04L 5/003; H04L 5/0032; H04L 5/0035; H04L 5/007; H04L 5/0073; H04B 7/024; H03J 2200/05
See application file for complete search history.

(56) References Cited

U.S. PATENT DOCUMENTS

| 6,563,893 B2* | 5/2003 | Smith | H03D 3/248 375/215 |
| 6,792,275 B1* | 9/2004 | Lo | H04W 16/04 370/329 |
| 7,142,861 B2* | 11/2006 | Murai | H04J 11/004 455/443 |

(Continued)

OTHER PUBLICATIONS

SIPO Office Action dated Nov. 30, 2016 in corresponding Chinese application (No. 201410284594.3).

*Primary Examiner* — Michael Thier
*Assistant Examiner* — Eric Nowlin
(74) *Attorney, Agent, or Firm* — McClure, Qualey & Rodack, LLP

(57) ABSTRACT

An automatic frequency calibration method and a small cell using the same are provided. The automatic frequency calibration method comprises the following steps. A set of at least one broadcasting message in a surrounding environment is received. Whether part of the at least one broadcasting message is transmitted from at least one first type base station is determined. If part of the at least one broadcasting message is transmitted from the first type base station, then a frequency of the small cell is calibrated according to one of the at least one first type base station whose signal strength is maximum among all of the at least one first type base station. If all of the at least one broadcasting message are not transmitted from the first type base station, the frequency of the small cell is calibrated according to at least one second type base station.

16 Claims, 6 Drawing Sheets

(56) References Cited

U.S. PATENT DOCUMENTS

| | | | | |
|---|---|---|---|---|
| 8,068,563 B2* | 11/2011 | Nekhamkin | | H04L 27/0014 375/326 |
| 8,175,203 B2* | 5/2012 | Zhu | | H04L 25/0224 375/229 |
| 8,761,051 B2* | 6/2014 | Brisebois | | H04W 24/00 370/254 |
| 9,320,045 B2* | 4/2016 | Sawai | | H04W 72/082 |
| 9,467,875 B2* | 10/2016 | Yang | | H04L 27/2666 |
| 2004/0005897 A1* | 1/2004 | Tomoe | | H04W 88/085 455/450 |
| 2005/0130662 A1* | 6/2005 | Murai | | H04J 11/004 455/444 |
| 2007/0097938 A1* | 5/2007 | Nylander | | H04L 29/12066 370/338 |
| 2008/0310563 A1* | 12/2008 | Zhu | | H04L 25/0224 375/346 |
| 2009/0042596 A1* | 2/2009 | Yavuz | | H04W 52/40 455/522 |
| 2010/0008323 A1* | 1/2010 | Deshpande | | H04W 48/12 370/331 |
| 2010/0029274 A1* | 2/2010 | Deshpande | | H04J 11/0093 455/435.3 |
| 2010/0054237 A1 | 3/2010 | Han et al. | | |
| 2010/0087203 A1* | 4/2010 | Lee | | H04W 72/082 455/452.2 |
| 2010/0098195 A1* | 4/2010 | Nekhamkin | | H04L 27/0014 375/344 |
| 2010/0099431 A1* | 4/2010 | Sampath | | H04W 16/16 455/454 |
| 2010/0120438 A1* | 5/2010 | Kone | | H04W 24/02 455/444 |
| 2010/0136996 A1* | 6/2010 | Han | | H04W 24/02 455/452.1 |
| 2010/0216486 A1* | 8/2010 | Kwon | | H04W 72/0426 455/452.2 |
| 2011/0003559 A1* | 1/2011 | Morita | | H04J 11/0056 455/67.14 |
| 2011/0151886 A1* | 6/2011 | Grayson | | H04W 16/04 455/452.1 |
| 2011/0190003 A1* | 8/2011 | Hiltunen | | H04W 72/085 455/452.1 |
| 2011/0281574 A1* | 11/2011 | Patel | | H04W 56/0015 455/422.1 |
| 2011/0299488 A1* | 12/2011 | Kim | | H04W 16/16 370/329 |
| 2011/0300807 A1* | 12/2011 | Kwun | | H04W 24/10 455/63.1 |
| 2012/0115498 A1* | 5/2012 | Kim | | H04W 52/244 455/452.2 |
| 2012/0184311 A1* | 7/2012 | Yamamoto | | H04W 56/002 455/502 |
| 2013/0189977 A1* | 7/2013 | Brisebois | | H04W 24/00 455/434 |
| 2014/0112250 A1* | 4/2014 | Bahrenburg | | H04B 1/7083 370/328 |
| 2015/0071100 A1* | 3/2015 | Yang | | H04L 27/2666 370/252 |
| 2015/0208314 A1* | 7/2015 | Lorca Hernando | | H04W 36/32 455/441 |
| 2015/0223149 A1* | 8/2015 | Liu | | H04W 48/12 370/252 |
| 2015/0334612 A1* | 11/2015 | Chaudhuri | | H04W 36/0094 455/437 |
| 2015/0373712 A1* | 12/2015 | Lee | | H04W 72/0453 370/329 |
| 2016/0249224 A1* | 8/2016 | Prasad | | H04W 16/14 |
| 2016/0249390 A1* | 8/2016 | Hans | | H04W 68/02 |
| 2016/0295490 A1* | 10/2016 | Eda | | H04W 16/32 |
| 2016/0360538 A1* | 12/2016 | Jwa | | H04W 72/085 |

* cited by examiner

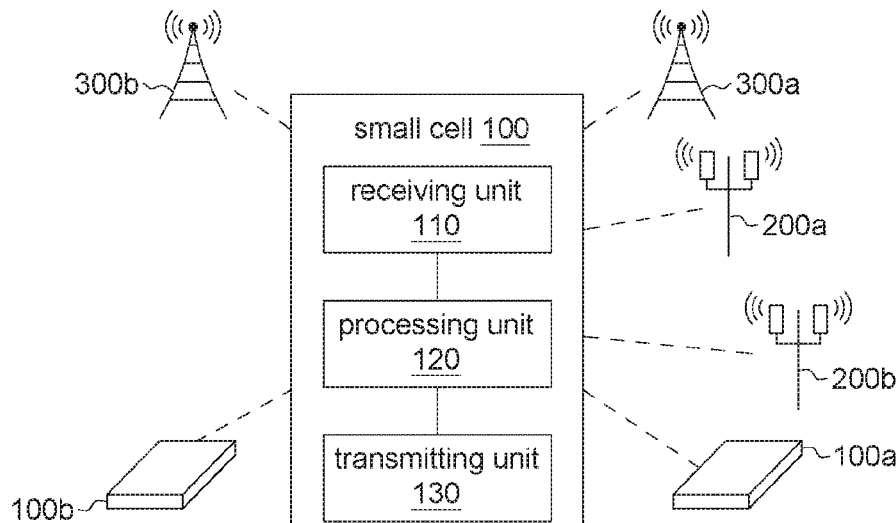
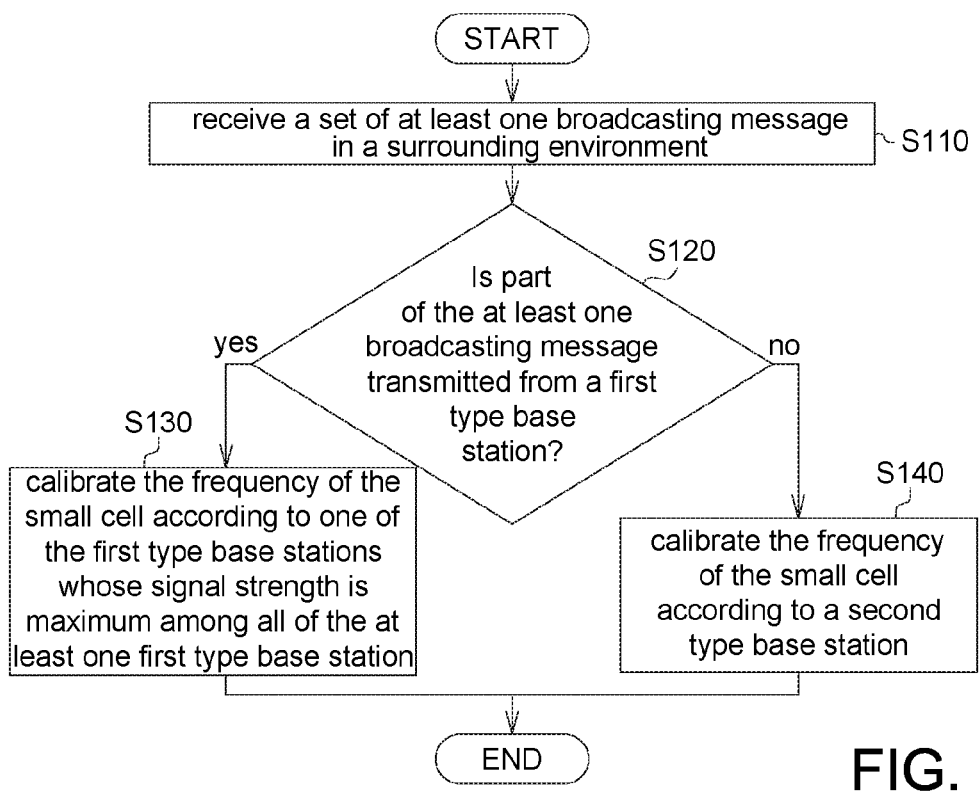
FIG. 1
FIG. 2

AUTOMATIC FREQUENCY CALIBRATION METHOD AND SMALL CELL USING THE SAME

This application claims the benefit of People's Republic of China application Serial No. 201410284594.3, filed Jun. 23, 2014, the disclosure of which is incorporated by reference herein in its entirety.

BACKGROUND

Technical Field

The disclosure relates in general to a wireless communications, and more particularly to an automatic frequency calibration method and a small cell using the same.

Description of the Related Art

For improving the telecommunication service and the quality thereof, the operator may set up a plurality of small cells to build up a dense telecommunications network. Examples of small cells include femtocells, picocells, and microcells.

However, the frequency of the small cell may offset due to long operation or the environmental temperature. Once the frequency offset of the small cell is too large, the small cell may not function normally.

SUMMARY

The disclosure is directed to an automatic frequency calibration method and a small cell using the same. The frequency of the small cell is calibrated according to the base station in the surrounding environment, such that the frequency of the small cell can be accurate.

According to one aspect of the invention, an automatic frequency calibration method of a small cell is provided. The automatic frequency calibration method comprises the following steps. A set of at least one broadcasting message in a surrounding environment is received. Whether part of the at least one broadcasting message is transmitted from at least one first type base station is determined. A signal coverage of the first type base station is larger than a signal coverage of the small cell. If part of the at least one broadcasting message is transmitted from the first type base station, then a frequency of the small cell is calibrated according to one of the at least one first type base station whose signal strength is maximum among all of the at least one first type base station. If all of the at least one broadcasting message are not transmitted from the first type base station, the frequency of the small cell is calibrated according to at least one second type base station. A signal coverage of the second type base station is smaller than the signal coverage of the first type base station.

According to another aspect of the invention, a small cell is provided. The small cell comprises a receiving unit and a processing unit. The receiving unit is used for receiving a set of at least one broadcasting message in a surrounding environment. The processing unit is used for determining whether part of the at least one broadcasting message is transmitted from at least one first type base station. A signal coverage of the first type base station is larger than a signal coverage of the small cell. If part of the at least one broadcasting message is transmitted from the first type base station, then the processing unit calibrates a frequency of the small cell according to one of the at least one first type base station whose signal strength is maximum among all of the at least one first type base station. If all of the at least one broadcasting message are not transmitted from the first type base station, then the processing unit calibrates the frequency of the small cell according to at least one second type base station. A signal coverage of the second type base station is smaller than the signal coverage of the first type base station.

BRIEF DESCRIPTION OF THE DRAWINGS

FIG. 1 shows a small cell and its surrounding environment according to an embodiment.

FIG. 2 shows a flowchart of an automatic frequency calibration method of the small cell according to an embodiment.

Figure 3A:
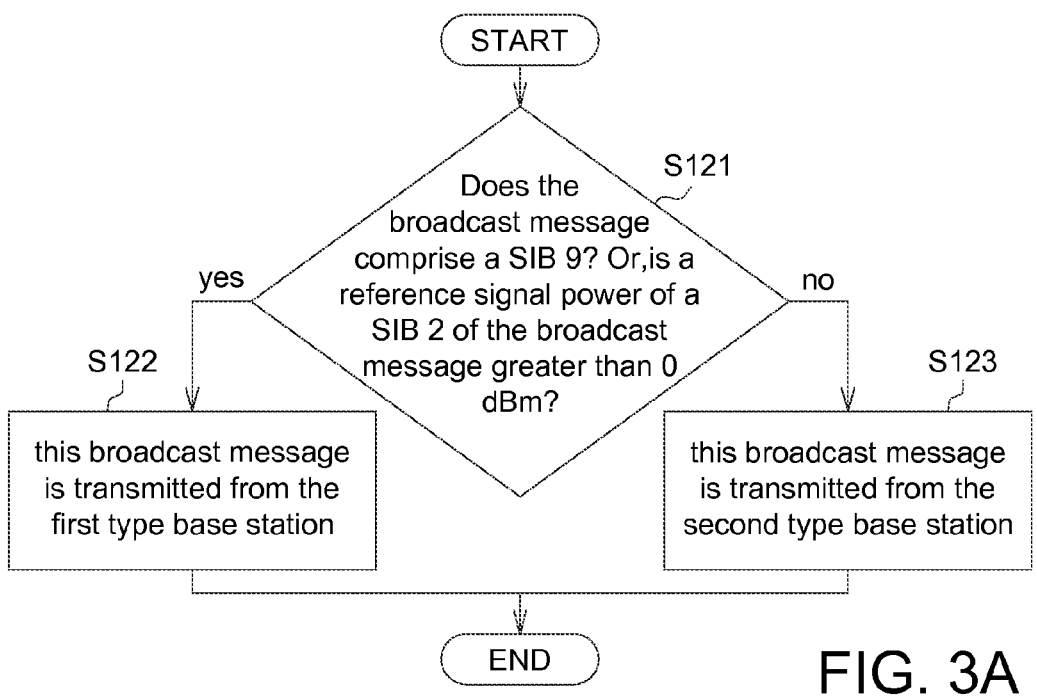
FIG. 3A shows exemplary details of the step S120 in FIG. 2 in a case that the small cell is a 4G LTE small cell.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIGS. 1 and 2. FIG. 1 shows a small cell 100 and its surrounding environment according to an embodiment. FIG. 2 shows a flowchart of an automatic frequency calibration method of the small cell 100 according to an embodiment. The small cell 100 includes a receiving unit 110, a processing unit 120 and a transmitting unit 130. The receiving unit 110 receives wireless signals. The processing unit 120 performs processing procedures, calculating procedures and determining procedures. The processing unit 120 may be an integrated circuit (IC). The transmitting unit 130 transmits wireless signals. The receiving unit 110 and the transmitting unit 130 may be a combination of an antenna module, an analog/digital converter and a radio frequency controlling chip. The receiving unit 110 and the transmitting unit 130 may be integrated into a single transceiver.

The frequency of the small cell 100 of the present embodiment may be automatically calibrated by performing the following automatic frequency calibration method. The small cell 100 may perform the calibration method from time to time to prevent frequency offset from becoming too large.

In step S110, the receiving unit 110 of the small cell 100 receives a set of at least one broadcasting message in a surrounding environment. The broadcasting message may be transmitted from Macrocells 300a, 300b, whose signal coverage is 500 to 1000 meters, Picocells 200a, 200b, whose signal coverage is 100 to 500 meters or small cells 100a, 100b, whose signal coverage is 1 to 100 meters. A signal coverage of the first type base station is larger than a signal coverage of the small cell 100. For example, each of the Macrocells 300a, 300b and the Picocells 200a, 200b is the first type base station. A signal coverage of the second type base station is not larger than the signal coverage of the small cell 100. For example, each of the small cells 100a, 100b is the second type base station.

In step S120, the processing unit 120 determines whether part of the at least one broadcasting message is transmitted from the first type base station. If part of the at least one broadcasting message is transmitted from the first type base station, then the process proceeds to step S130; if all of the at least one broadcasting message are not transmitted from the first type base station, i.e. all of the at least one broadcasting message are transmitted from the second type base station, then the process proceeds to step S140.

Figure 3B:
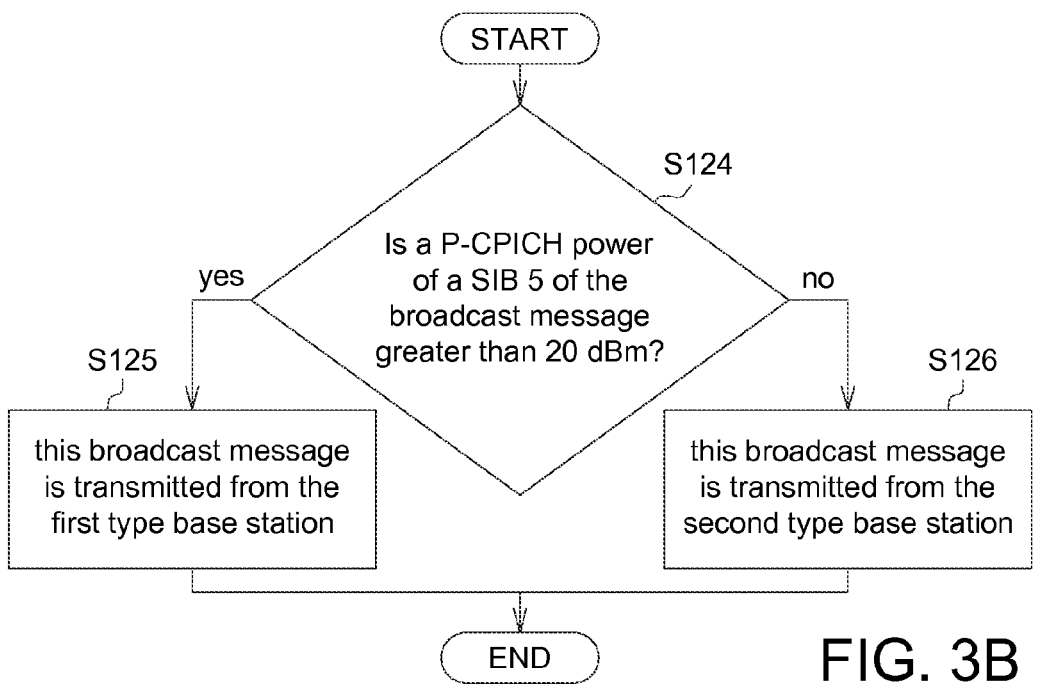
FIG. 3B shows exemplary details of the step S120 in FIG. 2 in a case that the small cell is a 3G WCDMA small cell.
Figure 3C:
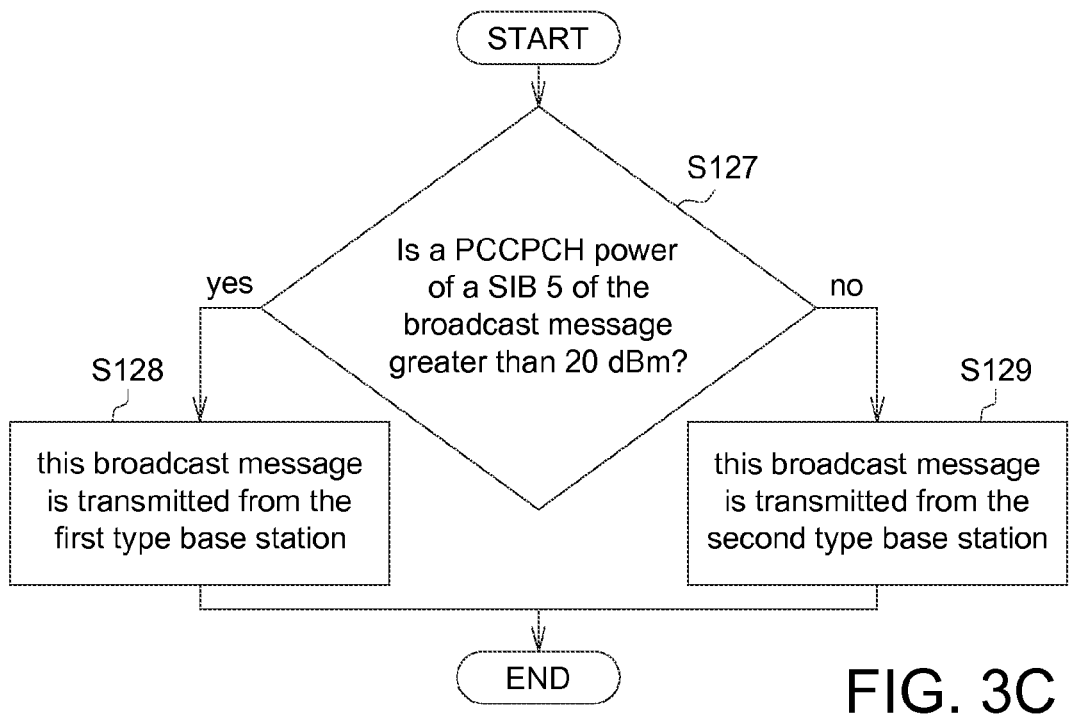
FIG. 3C shows exemplary details of the step S120 in FIG. 2 in a case that the small cell is a 3G TD-SCDMA small cell.

According to the specification of the small cell 100, there are different embodiments to perform the step S120. Please refer to FIGS. 3A to 3C. FIG. 3A shows exemplary details of the step S120 in FIG. 2 in a case that the small cell 100 is a 4G LTE small cell. FIG. 3B shows exemplary details of the step S120 in FIG. 2 in a case that the small cell 100 is a 3G WCDMA small cell. FIG. 3C shows exemplary details of the step S120 in FIG. 2 in a case that the small cell 100 is a 3G TD-SCDMA small cell.

As shown in FIG. 3A, in the case that the small cell 100 is a 4G LTE small cell, whether the broadcast message is transmitted from the first type base station or the second base station can be determined by performing the steps in FIG. 3A. In step S121, the processing unit 120 determines whether the broadcast message comprises a SIB 9; or whether a reference signal power of a SIB 2 of the broadcast message is greater than 0 dBm. If the result of the determination is "yes", then the process proceeds to step S122; otherwise, the process proceeds to step S123. In step S122, the processing unit 120 determines that this broadcast message is transmitted from the first type base station. In step S123, the processing unit 120 determines that this broadcast message is transmitted from the second type base station.

As shown in FIG. 3B, in the case that the small cell 100 is a 3G WCDMA small cell, whether the broadcast message is transmitted from the first type base station or the second base station can be determined by performing the steps in FIG. 3B. In step S124, the processing unit 120 determines whether a P-CPICH power of a SIB 5 of the broadcast message is greater than 20 dBm. If the result of the determination is "yes", then the process proceeds to step S125; otherwise, the process proceeds to step S126. In step S125, the processing unit 120 determines that this broadcast message is transmitted from the first type base station. In step S126, the processing unit 120 determines that this broadcast message is transmitted from the second type base station.

As shown in FIG. 3C, in the case that the small cell 100 is a 3G TD-SCDMA small cell, whether the broadcast message is transmitted from the first type base station or the second base station can be determined by performing the steps in FIG. 3C. In step S127, the processing unit 120 determines whether a PCCPCH power of a SIB 5 of the broadcast message is greater than 20 dBm. If the result of the determination is "yes", then the process proceeds to step S128; otherwise, the process proceeds to step S129. In step S128, the processing unit 120 determines that this broadcast message is transmitted from the first type base station. In step S129, the processing unit 120 determines that this broadcast message is transmitted from the second type base station.

After performing the step S120 in FIG. 2, each broadcast message can be determined as being transmitted from the first type base station or the second type base station.

As shown in FIG. 1, the broadcast messages received by the small cell 100 are transmitted from two Macrocells 300a, 300b, two Picocells 200a, 200b and two small cells 100a, 100b. Because some broadcast messages are transmitted from the first type base stations, the process proceeds to step S130. In step S130, the processing unit 120 calibrates the frequency of the small cell 100 according to one of the first type base stations whose signal strength is maximum among all of the at least one first type base station.

Figure 4:
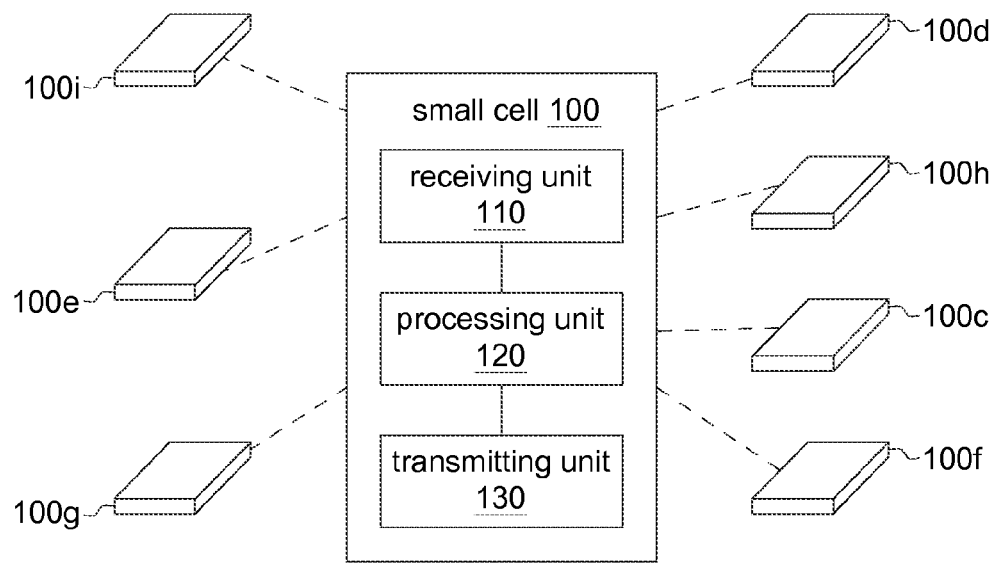
FIG. 4 shows the small cell and its surrounding environment according to another embodiment.

Please refer to FIG. 4. FIG. 4 shows the small cell 100 and its surrounding environment according to another embodiment. The broadcast messages received by the small cell 100 are transmitted from seven small cells 100c, 100d, 100e, 100f, 100g, 100h and 100i. Because all of the broadcast messages are not transmitted from the first type base station, i.e. all of the broadcast messages are transmitted from the second type base station, the process proceeds to step S140. In step S140, the processing unit 120 calibrates the frequency of the small cell 100 according to the second type base station, such as the small cells 100c, 100d, 100e, 100f, 100g, 100h and 100i.

The automatic frequency calibration method of FIG. 2 can be performed from time to time, such that the frequency of the small cell 100 can be accurate all the time.

Figure 5A:
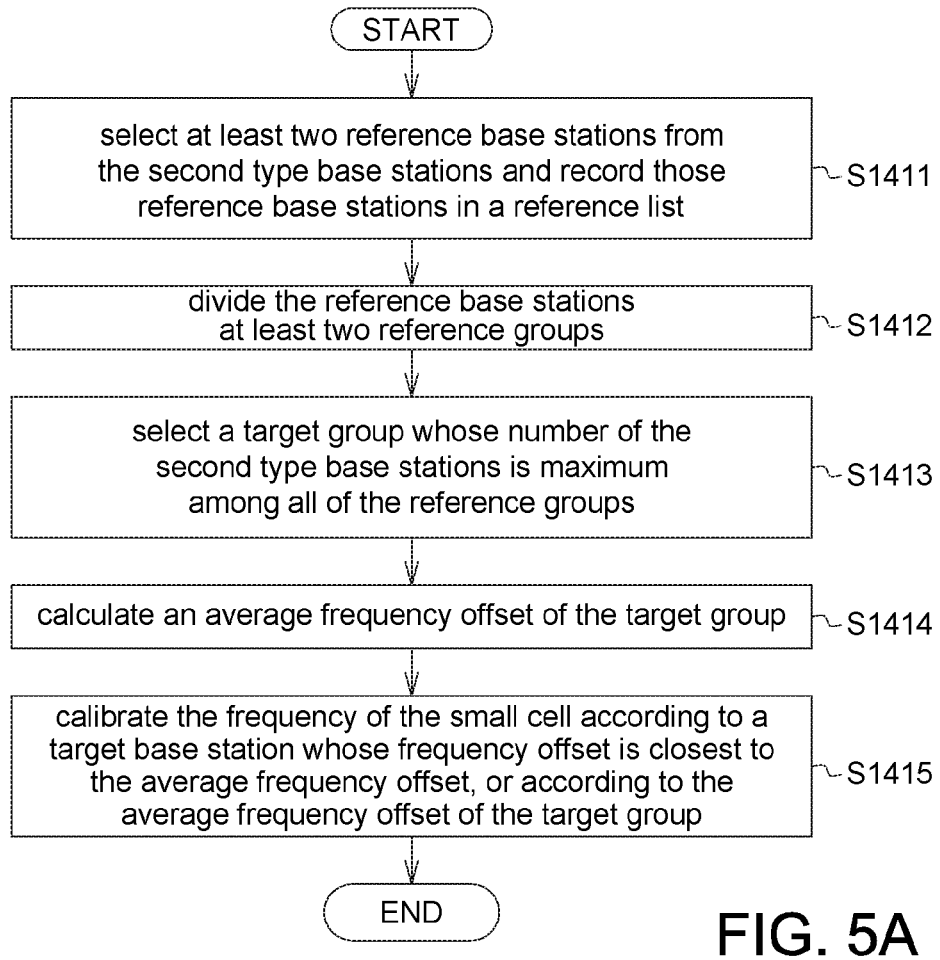
FIG. 5A shows exemplary details of the step S140 in FIG. 2 according to one embodiment.
Figure 6A:
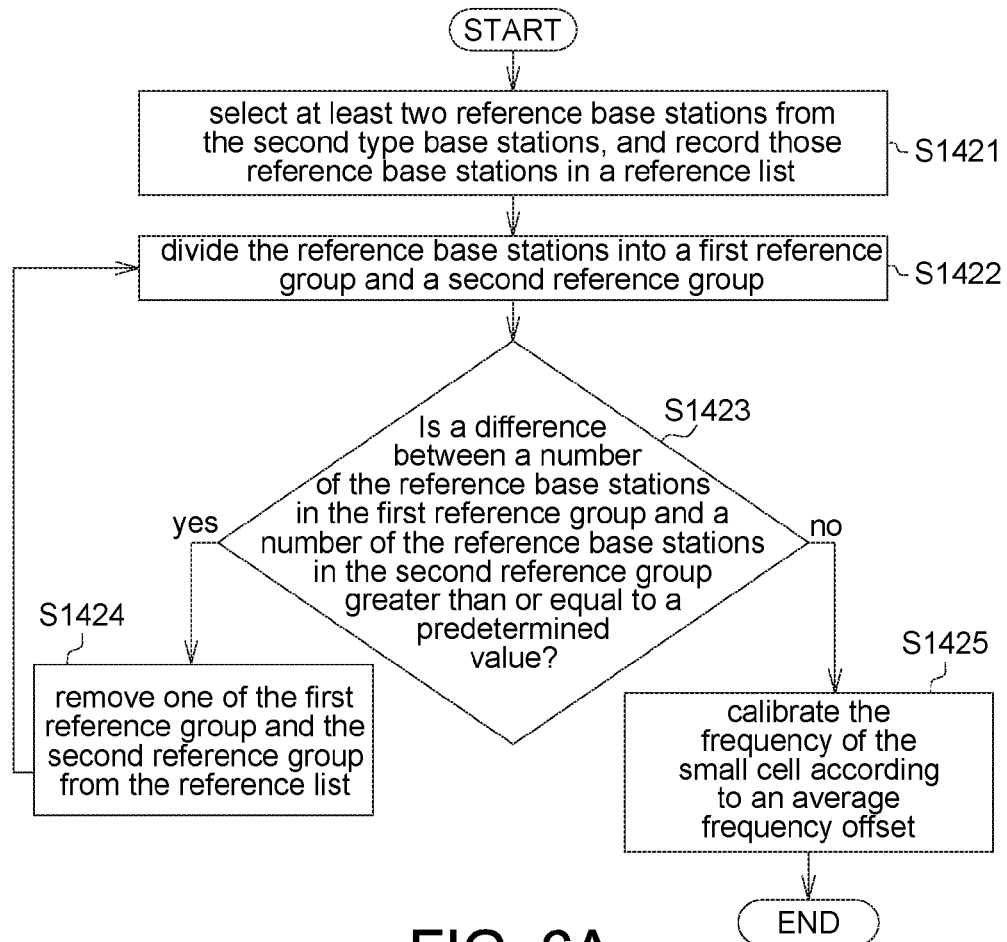
FIG. 6A shows exemplary details of the step S140 in FIG. 2 according to another embodiment.
Figure 7A:
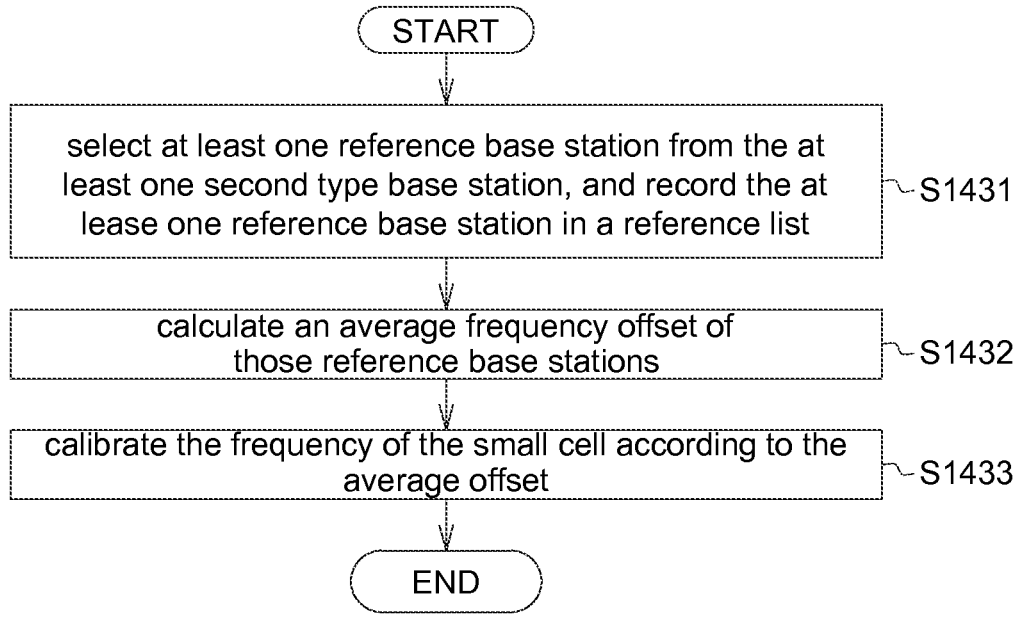
FIG. 7A shows exemplary details of the step S140 in FIG. 2 according to another embodiment.

According to other design requirement, the step S140 can be performed by several ways. For example, please refer to FIGS. 5A, 6A and 7A. FIGS. 5A, 6A and 7A show exemplary details of the step S140 in FIG. 2 according to three different embodiments.

Figure 5B:
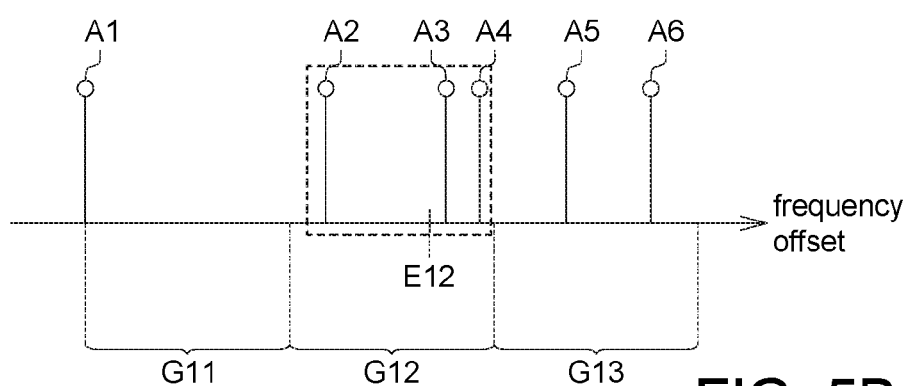
FIG. 5B illustrates a calibration process performed according to the steps in FIG. 5A.

FIG. 5B illustrates a calibration process performed according to the steps in FIG. 5A. In step S1411, the processing unit 120 selects at least two reference base stations A1, A2, A3, A4, A5 and A6 from the second type base stations, such as small cells 100c, 100d, 100e, 100f, 100g, 100h and 100i, and records those reference base stations A1 to A6 in a reference list. In this step, some of the second type base stations which have been calibrated according to any first type base station can be selected to be the reference base stations. Or, in another embodiment, if all of the second type base stations are not calibrated according to any first base station, all of the second type base stations can be selected to be the reference base stations. As such, some of the second type base stations whose frequencies are accurate can be selected to be the reference base stations first.

In step S1412, the processing unit 120 divides the reference base stations A1 to A6 into at least two reference groups G11, G12 and G13. Frequency offset ranges of all of the reference groups G11, G12 and G13 do not overlap with each other. The frequency offset of each reference base station A1, A2, A3, A4, A5 or A6 is the difference between the frequency of each reference base station A1, A2, A3, A4, A5 or A6 and the frequency of the small cell 100.

In one embodiment, the size of the frequency offset range of each reference group G11, G12 or G13 can be N times of a tolerate value. N is 0.1 to 2. For example, if the tolerate value is ±100 Hz and N is 0.5, then the size of the frequency offset range of each reference group G11, G12 or G13 can be set as 100 Hz.

In S1413, the processing unit 120 selects a target group whose number of the second type base stations is maximum among all of the reference groups, such as the reference group G12 which is surrounded by dashed lines, from the reference groups G11 to G13. In step S1414, the processing unit 120 calculates an average frequency offset E12 of the target group, such as the reference group G12. In step S1415, the processing unit 120 calibrates the frequency of the small cell 100 according to a target base station whose frequency offset is closest to the average frequency offset E12, such as the reference base station A3, or according to the average frequency offset E12 of the target group, such as the reference group G12.

Figure 6B:
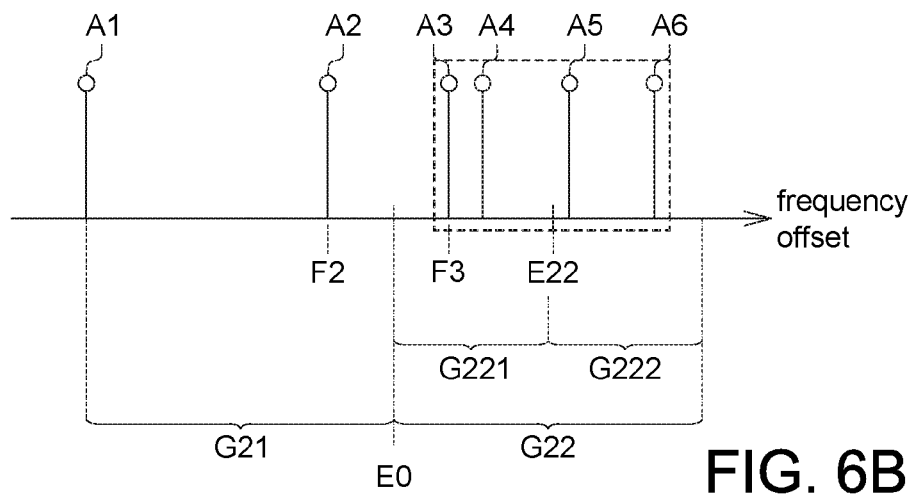
FIG. 6B illustrates a calibration process performed according to the steps in FIG. 6A.

FIG. 6B illustrates a calibration process performed according to the steps in FIG. 6A. In step S1421, the processing unit 120 selects at least two reference base stations A1 to A6 from the second type base stations, such as the small cells 100c to 100i, and records those reference base stations A1 to A6 in a reference list. Step S1421 is similar to the step S1411, and the details are not repeated here.

In step S1422, the processing unit 120 divides the reference base stations A1 to A6 into a first reference group G21 and a second reference group G22. A maximum frequency offset F2 of the first reference group G21 is smaller than an average frequency offset E0 of all of the reference base stations A1 to A6. A minimum frequency offset F3 of the second reference group G22 is greater than or equal to the average frequency offset E0 of the reference base stations A1 to A6.

In step S1423, the processing unit 120 determines whether a difference between a number of the reference base stations in the first reference group G21 and a number of the reference base stations in the second reference group G22 is greater than or equal to a predetermined value, such as 2. If the difference is greater than or equal to the predetermined value, then the process proceeds to S1424; otherwise, the process proceeds to S1425.

In step S1424, the processing unit 120 removes one of the first reference group G21 and the second reference group G22 from the reference list. If the number of the reference base stations in the first reference group G21 is less than the number of the reference base stations in the second reference group G22, then the first reference group G21 is removed from the reference list. If the number of the reference base stations in the second reference group G22 is less than the number of the reference base stations in the first reference group G21, then the second reference group G22 is removed from the reference list. For example, the first reference group G21 is removed from the reference list, and the process back to the step S1422.

During the process of performing the step S1422 second times, the processing unit 120 divides the reference base stations A3 to A6 into another first reference group G221 and another second group G222. Afterwards, during the process of performing the step S1423 second times, the processing unit 120 determines whether a difference between a number of the reference base stations in the first reference group G221 and a number of the reference base stations in the second reference group G222 is greater than or equal to a predetermined value, such as 2. If the difference is smaller than the predetermined value, then the process proceeds to step S1425. As shown in FIG. 6B, the difference is 0, then the process proceeds to step S1425.

In step S1425, the process unit 120 calibrates the frequency of the small cell 100 according to an average frequency offset E22 of the reference group G22 which is surrounded by a dashed lines.

Figure 7B:
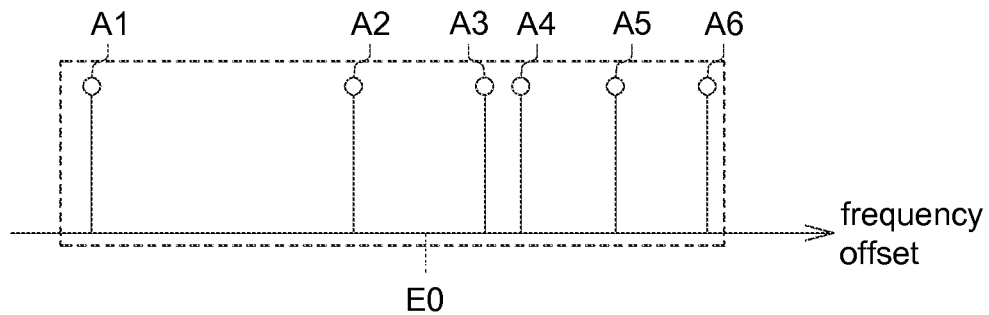
FIG. 7B illustrates a calibration process performed according to the steps in FIG. 7A.

FIG. 7B illustrates a calibration process performed according to the steps in FIG. 7A. In step S1431, the processing unit 120 selects at least one reference base station A1 to A6 from the at least one second type base station, such as the small cells 100c to 100i, and records the at least one reference base station A1 to A6 in a reference list.

In step S1432, the processing unit 120 calculates an average frequency offset E0 of those reference base stations A1 to A6 which are surrounded with a dashed line.

In step S1433, the processing unit 120 calibrates the frequency of the small cell 100 according to the average offset E0.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An automatic frequency calibration method of a small cell, wherein the automatic frequency calibration method comprises:
   receiving a set of at least one broadcasting message in a surrounding environment;
   determining whether part of the at least one broadcasting message is transmitted from at least one first type base station, wherein a signal coverage of the first type base station is larger than a signal coverage of the small cell;
   when part of the at least one broadcasting message is transmitted from the first type base station, calibrating a frequency of the small cell according to one of the at least one first type base station whose signal strength is maximum among all of the at least one first type base station; and
   when all of the at least one broadcasting message are not transmitted from the first type base station, calibrating the frequency of the small cell according to an average frequency offset of at least two reference base stations which are selected from at least two second type base stations, wherein a signal coverage of each of the second type base stations is smaller than the signal coverage of the first type base station.

2. The automatic frequency calibration method according to claim 1, wherein the first type base station is a Macrocell or a Picocell, and each of the second type base stations is a small cell.

3. The automatic frequency calibration method according to claim 1, wherein in the step of determining whether part of the at least one broadcasting message is transmitted from the first type base station, one of the at least one broadcasting message which comprises a SIB 9 is determined as being transmitted from the first type base station.

4. The automatic frequency calibration method according to claim 1, wherein in the step of determining whether part of the at least one broadcasting message is transmitted from the first type base station, one of the at least one broadcasting message whose reference signal power of a SIB 2 is greater than 0 dBm is determined as being transmitted from the first type base station.

5. The automatic frequency calibration method according to claim 1, wherein in the step of determining whether part of the at least one broadcasting message is transmitted from the first type base station, one of the at least one broadcasting message whose P-CPICH power of a SIB 5 is greater than 20 dBm is determined as being transmitted from the first type base station.

6. The automatic frequency calibration method according to claim 1, wherein in the step of determining whether part of the at least one broadcasting message is transmitted from the first type base station, one of the at least one broadcasting message whose PCCPCH power of a SIB 5 is greater than 20 dBm is determined as being transmitted from the first type base station.

7. The automatic frequency calibration method according to claim 1, wherein the step of calibrating the frequency of the small cell according to the average frequency offset comprises:
   selecting the at least two reference base stations form the at least two second type base stations, and recording the reference base stations in a reference list;
   dividing the reference base stations into at least two reference groups, wherein frequency offset ranges of all of the reference groups do not overlap with each other;
   selecting a target group whose number of the second type base stations is maximum among all of the reference groups;
   calculating the average frequency offset of the target group; and
   calibrating the frequency of the small cell according to a target base station whose frequency offset is closest to the average frequency offset or according to the average frequency offset of the target group.

8. The automatic frequency calibration method according to claim 7, wherein the frequency offset ranges of the reference groups have the same size.

9. The automatic frequency calibration method according to claim 7, wherein the size of the frequency offset range of each reference group is N times of a tolerate value, and N is between 0.1 and 2.

10. The automatic frequency calibration method according to claim 1, wherein the step of calibrating the frequency of the small cell according to the average frequency offset comprises:
   selecting the at least two reference base stations from the at least two second type base stations, and recording the reference base stations in a reference list;
   dividing the reference base stations into a first reference group and a second reference group, wherein a maximum frequency offset of the first reference group is smaller than the average frequency offset of all of the reference base stations which are currently recorded in the reference list, and a minimum frequency offset of all of the second reference group is greater than or equal to the average frequency offset of all of the reference base stations which are currently recorded in the reference list;
   determining whether a difference between a number of the reference base stations in the first reference group and a number of the reference base stations in the second reference group is greater than or equal to a predetermined value;
   removing one of the first reference group and the second reference group from the reference list, if the difference is larger than or equal to the predetermined value, wherein the first reference group is removed, if the number of the reference base stations in the first reference group is less than the number of the reference base stations in the second reference group; the second reference group is removed, if the number of the reference base stations in the second reference group is less than the number of the reference base stations in the first reference group; and
   calibrating the frequency of the small cell according to the average frequency offset of all of the reference base stations which are currently recorded in the reference list, if the difference is smaller than the predetermined value.

11. The automatic frequency calibration method according to claim 1, wherein the step of calibrating the frequency of the small cell according to the average frequency offset comprises:
   selecting the at least two reference base stations from the at least two second type base stations, and recording the at least two reference base stations in a reference list;
   calculating the average frequency offset of the at least two reference base stations; and
   calibrating the frequency of the small cell according to the average frequency offset.

12. The automatic frequency calibration method according to claim 1, wherein the step of calibrating the frequency of the small cell according to the average frequency offset comprises:
   selecting the at least two reference base stations form the at least two second type base stations;
   dividing the reference base stations into at least two reference groups;
   selecting a target group among all of the reference groups;
   calculating the average frequency offset of the target group; and
   calibrating the frequency of the small cell according to a target base station whose frequency offset is closest to the average frequency offset or according to the average frequency offset of the target group.

13. The automatic frequency calibration method according to claim 1, wherein the step of calibrating the frequency of the small cell according to the average frequency offset comprises:
   selecting the at least two reference base stations from the at least two second type base stations, and recording the reference base stations in a reference list;
   dividing the reference base stations into a first reference group and a second reference group;
   removing one of the first reference group and the second reference group from the reference list, if a predetermined condition is satisfied; and
   calibrating the frequency of the small cell according to the average frequency offset of all of the reference base stations, if the predetermined condition is not satisfied.

14. The automatic frequency calibration method according to claim 1, wherein the step of calibrating the frequency of the small cell according to the average frequency offset comprises:
   selecting the at least two reference base stations from the at least two second type base stations;
   calculating the average frequency offset of the at least two reference base stations; and
   calibrating the frequency of the small cell according to the average frequency offset.

15. A small cell, comprising:
   a receiving unit, used for receiving a set of at least one broadcasting message in a surrounding environment; and
   a processing unit, used for determining whether part of the at least one broadcasting message is transmitted from at least one first type base station, wherein a signal coverage of the first type base station is larger than a signal coverage of the small cell;

wherein when part of the at least one broadcasting message is transmitted from the first type base station, then the processing unit calibrates a frequency of the small cell according to one of the at least one first type base station whose signal strength is maximum among all of the at least one first type base station;

when all of the at least one broadcasting message are not transmitted from the first type base station, then the processing unit calibrates the frequency of the small cell according to an average frequency offset of at least two reference base stations which are selected from at least two second type base stations, and a signal coverage of the second type base station is smaller than the signal coverage of the first type base station.

16. The small cell according to claim 15, wherein the first type base station is a Macrocell or a Picocell, and each of the second type base stations is a small cell.

* * * * *